United States Patent
Torii

(10) Patent No.: US 9,568,819 B2
(45) Date of Patent: Feb. 14, 2017

(54) HOLDING APPARATUS, IMPRINT APPARATUS AND ARTICLE MANUFACTURING METHOD USING SAME

(75) Inventor: Hirotoshi Torii, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 77 days.

(21) Appl. No.: 13/360,994

(22) Filed: Jan. 30, 2012

(65) Prior Publication Data

US 2012/0193832 A1 Aug. 2, 2012

(30) Foreign Application Priority Data

Feb. 2, 2011 (JP) ................................. 2011-020494

(51) Int. Cl.
| | | |
|---|---|---|
| *B28B 11/08* | (2006.01) | |
| *G03F 7/00* | (2006.01) | |
| *B82Y 10/00* | (2011.01) | |
| *B82Y 40/00* | (2011.01) | |

(52) U.S. Cl.
CPC .............. *G03F 7/0002* (2013.01); *B82Y 10/00* (2013.01); *B82Y 40/00* (2013.01)

(58) Field of Classification Search
CPC .................................................. G03F 7/0002
USPC ......... 264/293, 39, 40.5; 425/150, 385, 170, 425/171
See application file for complete search history.

(56) References Cited

U.S. PATENT DOCUMENTS

| | | | | |
|---|---|---|---|---|
| 8,390,233 | B2 * | 3/2013 | Shilpiekandula | B82Y 10/00 318/135 |
| 2005/0006343 | A1 * | 1/2005 | Choi | B29C 43/003 216/59 |
| 2005/0270516 | A1 * | 12/2005 | Cherala et al. | 355/72 |
| 2005/0271955 | A1 * | 12/2005 | Cherala | B82Y 10/00 430/22 |
| 2006/0145400 | A1 * | 7/2006 | Colburn et al. | 264/494 |
| 2006/0279022 | A1 * | 12/2006 | Seki | B82Y 10/00 264/320 |
| 2009/0108484 | A1 * | 4/2009 | Kruijt-Stegeman | B82Y 10/00 264/40.5 |
| 2010/0044917 | A1 * | 2/2010 | Kruijt-Stegeman et al. | 264/293 |
| 2012/0061875 | A1 * | 3/2012 | Kono | B29C 59/022 264/293 |
| 2012/0105817 | A1 * | 5/2012 | Hoogendam et al. | 355/67 |
| 2013/0134630 | A1 * | 5/2013 | Miyata | G03F 7/0002 264/293 |

FOREIGN PATENT DOCUMENTS

| | | |
|---|---|---|
| JP | 2008504141 A | 2/2008 |
| WO | 2005121892 A2 | 12/2005 |

* cited by examiner

*Primary Examiner* — Ryan Ochylski
(74) *Attorney, Agent, or Firm* — Rossi, Kimms & McDowell LLP

(57) ABSTRACT

A holding apparatus of the present invention for holding a mold, includes a chuck configured to attract the mold to hold the mold, including a plurality of holding units each of which is configured to hold the attracted mold, and including a support configured to support the plurality of holding units; and an actuator supported by the support and deforms the mold by applying a force. At least one of the holding units is supported by the support unit so as to be displaceable in the direction of the force applied by the actuator.

26 Claims, 5 Drawing Sheets

HOLDING APPARATUS, IMPRINT APPARATUS AND ARTICLE MANUFACTURING METHOD USING SAME

BACKGROUND OF THE INVENTION

Field of the Invention

The present invention relates to a holding apparatus, an imprint apparatus, and an article manufacturing method using the imprint apparatus.

Description of the Related Art

As the demand for microfabrication of semiconductor devices increases, not only a conventional photolithography technology but also a microfabrication technology in which an uncured resin on a substrate is molded using a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint resin, photocurable resin) to a shot area (imprint area) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

In general, a holding apparatus that holds a mold, which is provided in the imprint apparatus, includes a magnification correction mechanism that corrects pattern magnification error generated during semiconductor processing. The magnification correction mechanism is constituted by a drive unit, a sensor for controlling the drive amount of the drive unit, and the like, and is provided at a plurality of locations so as to enclose the outer peripheral portion of a mold. In this case, the drive unit imparts an external force to a mold, and deforms the mold itself to thereby correct the pattern shape formed in the mold. In such cases, since the pattern shape may affect the overlay accuracy of patterns, correction with high accuracy of a few nanometers or less is required for dealing with microfabrication of pattern imprinting. Japanese Patent Laid-Open No. 2008-504141 discloses a correction device that performs magnification correction by applying a compressive force to the lateral surfaces of a mold.

Here, in the imprint apparatus, a mold is typically held via a mold chuck (mold attraction mechanism) that allows direct attraction (e.g., vacuum attraction) of the mold. The correction device disclosed in Japanese Patent Laid-Open No. 2008-504141 performs the magnification correction described above in a state where the mold chuck holds the mold in the mold-printing direction by attraction. Thus, a frictional force is exerted to the contact surface between the mold and the mold chuck in the direction of the compressive force to be applied by the correction device. In other words, the correction device performs magnification correction by rubbing the contact surface by applying a force greater than a frictional force to a mold. In such cases, since the contact areas for both of the mold and the mold chuck are relatively moved to each other, the contact state of both the mold and the mold chuck changes during driving of the correction device, and thus, a frictional force at the contact surface also varies. Hence, the ununiformed distortion occurs at the pattern portion formed in the mold, and thus, a desired pattern shape may not be obtained. Also, when rubbing occurs at the contact surface between the mold and the mold chuck, particles (dust) occur. Since such particles adhere to the surface of the mold or are entrapped between the mold and the substrate, the formation of a desired resin pattern may be inhibited.

SUMMARY OF THE INVENTION

In view of the foregoing, the present invention provides a holding apparatus advantageous in precision with which magnification correction of a mold is performed.

According to an aspect of the present invention, a holding apparatus for holding a mold is provided that includes a chuck configured to attract the mold to hold the mold, including a plurality of holding units each of which is configured to hold the attracted mold, and including a support configured to support the plurality of holding units; and an actuator supported by the support and configured to deform the mold by applying a force, wherein at least one of the plurality of holding units is supported by the support so as to be displaceable in the direction of the force applied by the actuator.

According to the present invention, a holding apparatus advantageous in precision with which magnification correction of a mold is performed may be provided.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

(Imprinting Apparatus)

Figure 1:
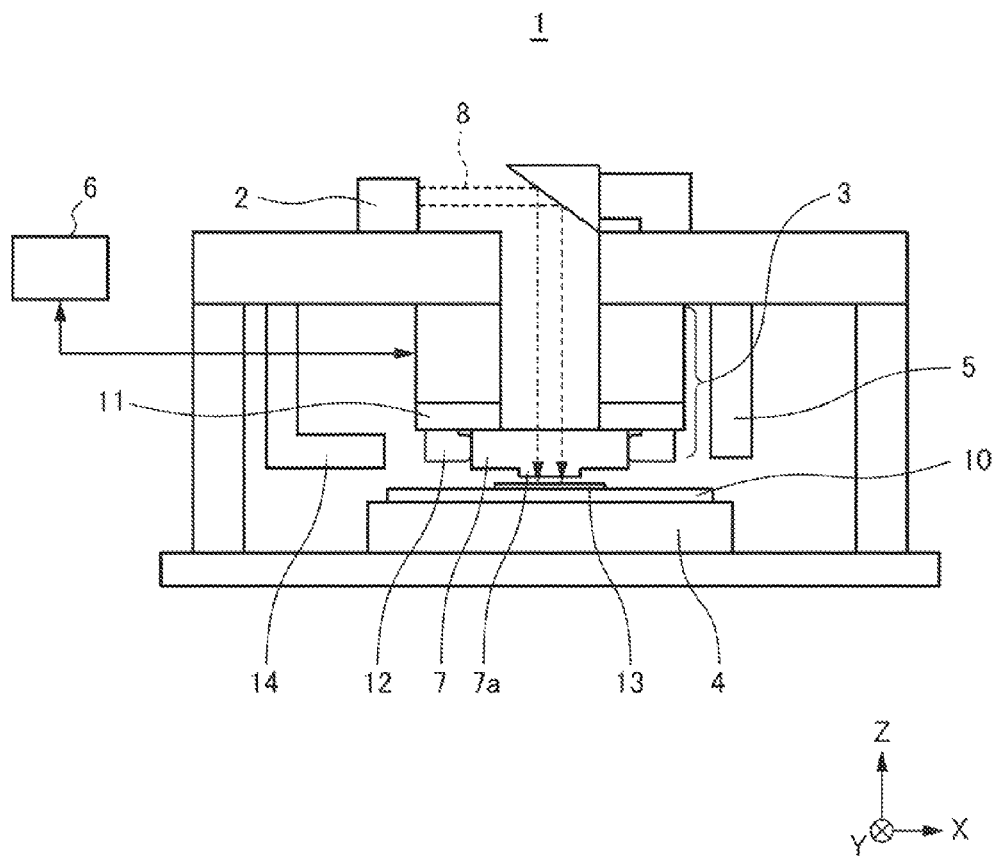
FIG. 1 is a view illustrating the configuration of an imprint apparatus according to an embodiment of the present invention.

Firstly, a description will be given of the configuration of an imprint apparatus according to an embodiment of the present invention. FIG. 1 is a view illustrating the configuration of an imprint apparatus. The imprint apparatus is an apparatus that molds an uncured resin on a wafer (on a substrate), i.e., an object to be treated, using a mold to thereby form a resin pattern on the substrate, which is used in the manufacture of devices such as semiconductor devices and the like. Here, the imprint apparatus is an apparatus employing a photo-curing method. In the following drawings, a description will be given where the Z axis is aligned parallel to the optical axis of an illumination unit that illuminates ultraviolet light onto a resin on a substrate, and mutually orthogonal axes X and Y are aligned in the direction in a plane perpendicular to the Z axis. An imprint apparatus 1 includes an illumination unit 2, a mold holding unit 3, a wafer stage 4, a dispenser 5, and a controller 6.

The illumination unit 2 is a unit configured to irradiate a mold 7 with ultraviolet light 8 during imprint processing. The illumination unit 2 is constituted by a light source (not shown) and an optical element that adjusts the ultraviolet light 8 emitted from the light source to a light suitable for imprinting. The mold 7 is a mold in which a predetermined pattern (e.g., a concave and convex pattern 7a such as a circuit pattern or the like) is three-dimensionally formed on the side facing a wafer 10. The material of the mold 7 is a material such as quartz or the like through which ultraviolet light can pass.

The mold holding unit (holding apparatus) 3 configured to attract and hold the mold 7 using a vacuum attraction force or an electrostatic force. The mold holding unit 3 includes a mold base 11 including a mold chuck, and a magnification correction mechanism (shape correction mechanism) 12 that corrects the concave and convex pattern 7a formed in the mold 7 into a desired shape by applying a compressive force to the mold 7 held by the mold base 11. The configuration of the mold base 11 and the magnification correction mechanism 12 will be described in detail below. Furthermore, the mold holding unit 3 includes a mold drive mechanism (not shown) that drives the mold holding unit 3 in the Z axial direction so as to press the mold 7 against an ultraviolet curable resin applied to the wafer 10. As an actuator employed for the mold drive mechanism, a linear motor, an air cylinder, and the like may be employed. The mold-printing operation and the mold-releasing operation performed by the imprint apparatus 1 may be realized by moving the mold 7 in the Z direction as described above, may be realized by moving the wafer stage 4 (the wafer 10) in the Z direction, or may also be realized by moving both the mold 7 and the wafer stage 4 (the wafer 10) in the Z direction.

The wafer 10 is an object to be treated consisting of, for example, a single crystal silicon, and an ultraviolet curable resin (hereinafter referred to simply as "resin"), which is molded by the mold 7, is applied to the treatment surface thereof. Also, the wafer stage 4 functions as a substrate holding unit that holds the wafer 10 by vacuum attraction and is moveable in the XY plane. As an actuator for driving the wafer stage 4, a linear motor may be employed. The dispenser 5 applies a resin 13 (uncured resin) to the wafer 10. Here, the resin 13 is a photocurable resin (imprint material) having the property of being cured by receiving irradiation of the ultraviolet light 8, and is appropriately selected depending on the manufacturing process of semiconductor devices or the like.

The controller 6 may control the operation, adjustment, and the like of the components of the imprint apparatus 1. The controller 6 is constituted by a computer or the like and is connected to the components of the imprint apparatus 1 through a line so as to execute control of the components by a program or the like. In the present embodiment, the controller 6 controls the operation of the mold holding unit 3 including at least the magnification correction mechanism 12. Note that the controller 6 may be integrated with the rest of the imprint apparatus 1, or may be installed at a location separate from the location where the rest of the imprint apparatus 1 is installed.

Next, imprint processing performed by the imprint apparatus 1 will now be described. First, the controller 6 places and fixes the wafer 10 on the wafer stage 4 using a substrate conveyance device 14, and then moves the wafer stage 4 to the application position of the dispenser 5. Then, as an application step, the dispenser 5 applies a resin (uncured resin) 13 to a predetermined shot (imprint area) on the wafer 10. Next, the controller 6 moves the wafer stage 4 such that the surface, to which the resin 13 is to be applied, on the wafer 10 is placed in a position directly below the mold 7. Next, after the imprint surface of the mold 7 is aligned with the coating surface on the wafer 10 and the magnification correction for the mold 7 is carried out using the magnification correction mechanism 12, the controller 6 drives the mold drive mechanism so as to press the mold 7 against the resin 13 on the wafer 10 (mold-pressing step). During the mold-pressing step, the resin 13 flows along the concave and convex pattern 7a by pressing the mold 7 thereagainst. Under this condition, the illumination unit 2 emits the ultraviolet light 8 from the back surface (top surface) of the mold 7, and the resin 13 is cured by the ultraviolet light 8 that has been transmitted through the mold 7 as a curing step. After the resin 13 is cured, the controller 6 again drives the mold drive mechanism to thereby release the mold 7 from the wafer 10 (mold-releasing step). By the aforementioned steps, the three dimensionally shaped layer of the resin 13 following the concave and convex pattern 7a is formed on the shot surface on the wafer 10.

(Holding Apparatus)

Figure 2A:
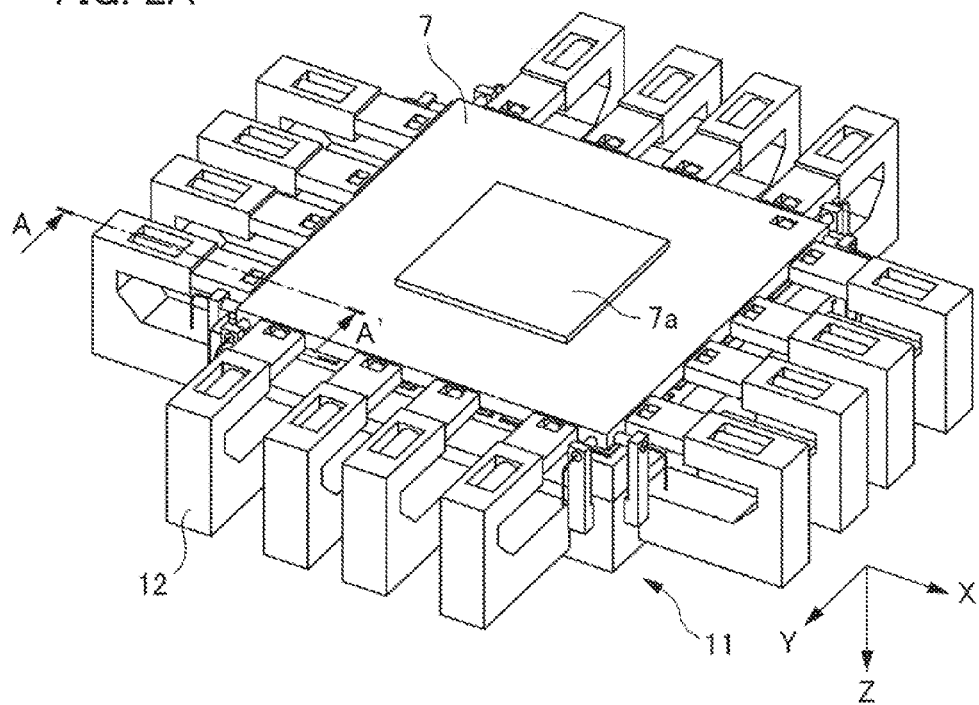
FIG. 2A is a perspective view illustrating the configuration of a mold holding unit according to an embodiment of the present invention.
Figure 2B:
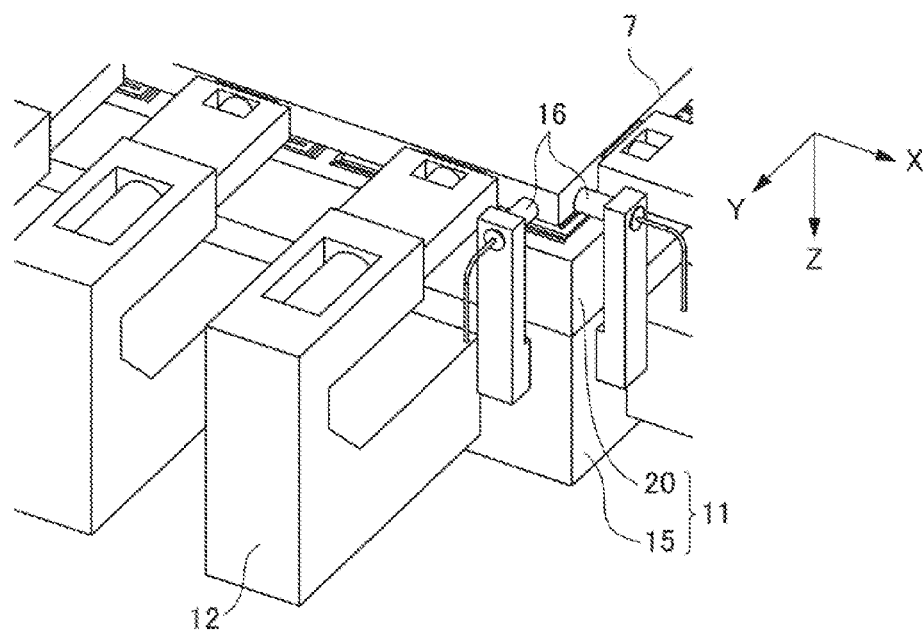
FIG. 2B is an enlarged perspective view illustrating an edge of the mold holding unit shown in FIG. 2A.

Next, a detailed description will be given of the configuration of the mold holding unit 3 that is a feature of the present embodiment. Each of FIGS. 2A and 2B is a view illustrating the configuration of the mold holding unit 3. In particular, FIG. 2A is a perspective view illustrating the mold holding unit 3 as viewed from the side of the wafer 10, and FIG. 2B is an enlarged perspective view illustrating an edge of the mold holding unit 3 shown in FIG. 2A. The mold base 11 includes a mold chuck (chuck) 20 that is an attraction mechanism for holding the mold 7 for imprinting by attraction, and a mold chuck base (support) 15 that fixes the mold chuck 20. In the present embodiment, the mold 7 is sucked by means of a vacuum attraction force. Also, the magnification correction mechanism 12 is provided at a plurality of location on the lateral surfaces of the mold chuck base 15 so as to respectively face the areas of the four lateral surfaces of the mold 7. In particular, in the present embodiment, as shown in FIG. 2A, four magnification correction mechanisms 12 are provided on one lateral surface of the mold 7, that is, sixteen magnification correction mechanisms 12 are provided on the periphery of the mold 7 in total. The number of the magnification correction mechanisms 12 installed may be changed appropriately depending on a desired pattern shape or desired accuracy. Furthermore, a plurality of position sensors 16 as shown in FIG. 2B is respectively provided on the edges of one lateral surface of the mold chuck base 15. The position sensor 16 is a detector that measures the position of the mold 7 when the mold 7 is exchanged, when the magnification correction mechanism 12 is driven, when a mold-printing operation is performed, and the like. As the position sensor 16, an eddy-current type displacement sensor, an electrostatic-capacity type displacement sensor, an optical type displacement sensor, or the like may be employed. In this case, the controller 6 controls the drive amount of an actuator 32, to be described below, serving as a drive unit for the magnification correction mechanism 12 based on the output of the position sensor 16, so that the mold 7 may be moved at a desired position or may be deformed into a desired shape.

Figure 3A:
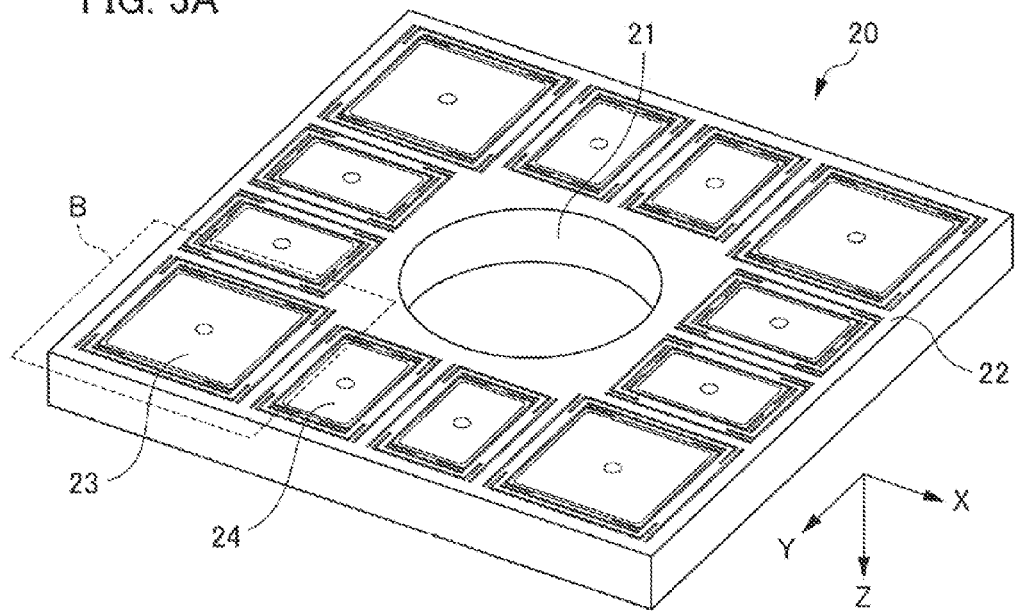
FIG. 3A is a view illustrating the shape of a mold chuck according to an embodiment of the present invention.
Figure 3B:
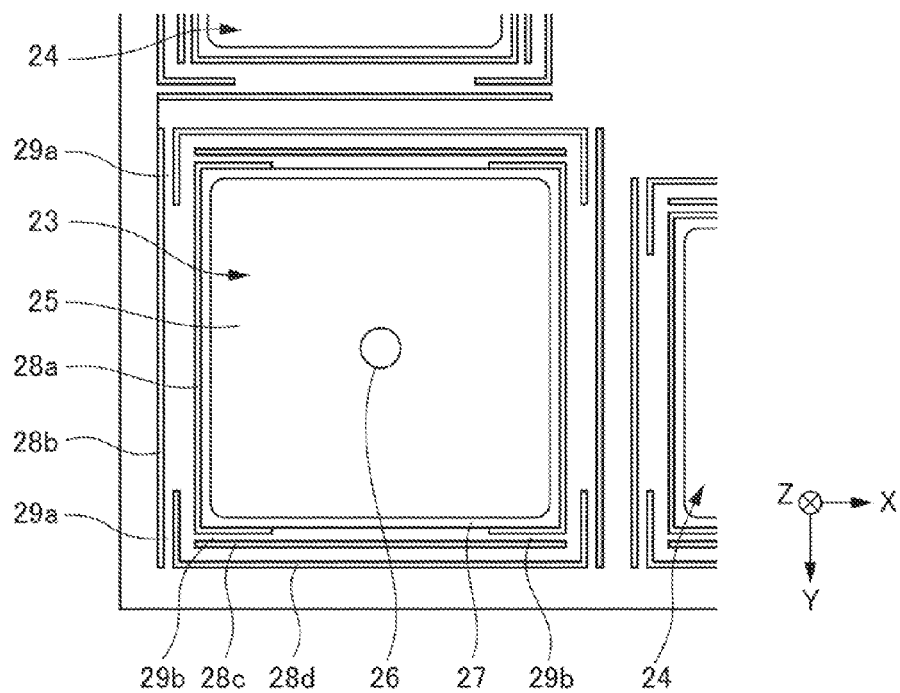
FIG. 3B is an enlarged plan view of the B portion shown in FIG. 3A.

Each of FIGS. 3A and 3B is a view illustrating the shape of the mold chuck 20. In particular, FIG. 3A is a perspective view of the mold chuck 20 as viewed from the attraction surface side, and FIG. 3B is an enlarged plan view of the B portion shown in FIG. 3A. The mold chuck 20 has a circular opening 21 through which ultraviolet light favorably passes at the central portion thereof, and further has two holding units (a first holding unit 23 and a second holding unit 24) having different areas for a attraction region, both of which are provided at an attraction surface 22 for attracting the mold 7. The first holding unit 23 is provided at the edges of four lateral surfaces of the attraction surface 22, and the second holding unit 24 is provided at each side sandwiched between two first holding units 23. In this case, the second holding unit 24 is provided at two locations at each side, that is, the second holding unit 24 is provided at eight locations at the entire attraction surface 22. Here, in the present embodiment, the area for the attraction region of the first holding unit 23 is set wider than that for the attraction region of the second holding unit 24. However, the size or the number of holding units provided is merely an example, and may be changed as appropriate.

As shown in FIG. 3B, the first holding unit 23 includes an exhaust portion 25 that has a substantially rectangular outer shape and has a predetermined depth, and a suction pore 26 that is provided at the central position of the exhaust portion 25. The suction pore 26 is in connection with a vacuum exhauster (not shown), and holds the mold 7 by bringing it into contact with a square-shaped contact part 27, which is formed along the outer periphery of the exhaust portion 25, by driving the vacuum exhauster to thereby exhaust the space formed between the exhaust portion 25 and the mold 7 by vacuum attraction. A pin-shaped contact part may newly be provided within the exhaust portion 25 so as to suppress the partial deformation of the mold 7 by attraction. Furthermore, the first holding unit 23 has a plurality of penetrating grooves 28, which extends from the attraction surface 22 to the fixed surface of the mold chuck base 15 opposite to the attraction surface 22, around the periphery of the exhaust portion 25. First, in the X-direction of the first holding unit 23, the penetrating grooves 28 have a first penetrating groove 28a of which the U-shaped opening is formed along one side (one region) of the outer peripheral portion of the contact part 27, and a second penetrating groove 28b of which the opening formed on the outside thereof so as to be adjacent to the first penetrating groove 28a is formed in a linear shape. In contrast, also in the Y-direction of the first holding unit 23, the penetrating grooves 28 have a third penetrating groove 28c and a fourth penetrating groove 28d which are respectively equivalent to the first penetrating groove 28a and the second penetrating groove 28b. Here, the opening of the third penetrating groove 28c formed along one side of the outer peripheral portion of the contact part 27 is formed in a linear shape, and the opening of the fourth penetrating groove 28d located outside thereof is formed in a substantially U-shape. The group of the first penetrating groove 28a and the second penetrating groove 28b, which extends along one side of the contact part 27, that is, extends in a direction perpendicular to the direction of the force to be applied by the actuator 32 to be described below, is formed at two locations at the left side and the right side of the X-direction on the basis of the contact part 27. Likewise, the group of the third penetrating groove 28c and the fourth penetrating groove 28d is formed at two locations at the top side and the bottom side of the Y-direction on the basis of the contact part 27. In such cases, the first holding unit 23 is flexibly supported by the group of the first penetrating groove 28a and the groove forming the fourth penetrating groove 28d and facing the first penetrating groove 28a so as to be displaceable in the X-direction in the interior of the mold chuck 20. In other words, the group is a leaf spring (elastic mechanism) 29a that function as an elastic body in the X-direction of the mold 7. Likewise, the first holding unit 23 is flexibly supported by the group of the third penetrating groove 28c and the groove forming the second penetrating groove 28b and facing the third penetrating groove 28c so as to be displaceable in the Y-direction in the interior of the mold chuck 20. In other words, the group is a leaf spring (elastic mechanism) 29b that function as an elastic body in the Y-direction of the mold 7. Note that the mold chuck 20 maintains high rigidity in the Z direction as compared with the X- and Y-directions. The magnification correction mechanism 12, to be described in detail below, applies a compressive force to the lateral surfaces of the mold 7 in both X- and Y-directions, and thus, the direction of the compressive force matches the direction of the displacement of the first holding unit 23. While penetrating grooves as those described above are formed in the second holding unit 24, the shapes of the penetrating grooves are the same as the penetrating grooves 28 with different dimensions in accordance with the shape of the contact part 27, and thus, no further description will be given here.

Figure 4:
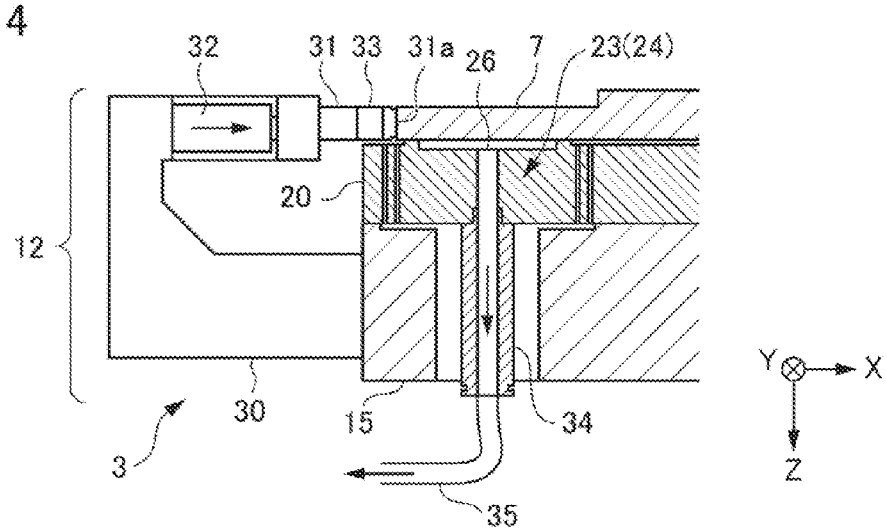
FIG. 4 is a cross sectional view illustrating the configuration of a mold holding unit according to an embodiment of the present invention.

FIG. 4 is a cross sectional view illustrating the configuration of the mold holding unit 3 including the magnification correction mechanism 12, as taken along the line of A-A' in FIG. 2A. The magnification correction mechanism 12 includes a support member 30 that forms a main body, a contact member 31 provided in the support member 30, and an actuator 32. The support member 30 is a cubic member of which the lateral surface in the Y axial direction is formed in a U-shape, and is fixed to the lateral surface of the mold chuck base 15. The contact member 31 is a cubic member that brings a contact surface 31a into contact with the lateral surface of the outer peripheral portion of the mold 7 and is movable in the X axial direction so as to transmit the compressive force (force) applied by the actuator 32 to the lateral surface of the mold 7. The contact member 31 further includes an input sensor 33 that measures the force generated by the actuator 32. In the present embodiment, it should be understood that a load cell that monitors the input quantity of the magnification correction mechanism 12 is employed as the input sensor 33. For example, a displacement sensor that measures the displacement of the actuator 32 or the amount of deformation of the mold 7 may also be employed. Also, the actuator 32 is a drive unit that is coaxially provided with the axis of movement of the contact member 31 and transmits the compressive force to the contact member 31. As the actuator 32, a piezoelectric element, a pneumatic actuator, a linear motion motor, or the like may be employed. The positions of all of the magnification correction mechanisms 12 installed with respect to the mold chuck base 15 correspond to the positions (displacement positions) where the holding units 23 and 24 for the mold base 11 are formed. The installed position (relative position) between the contact member 31 and the actuator 32 is arbitrary, and thus, the actuator 32 may not be coaxially provided with the axis of movement of the contact member 31 as in the present embodiment. On the other hand, the cross-sectional structure of the mold base 11 with respect to the magnification correction mechanism 12 is configured such that a joint member 34 is provided to the suction pore 26 provided in each of the holding units 23 and 24 of the mold chuck 20, and the joint member 34 is connected to a vacuum exhauster via a tube 35. It is desirable that the tube 35 be made of resin so as to flexibly support the holding units 23 and 24 in the X- and Y-directions.

Next, the effect of the mold holding unit 3 will be described. When the shape of the mold 7 is corrected in an imprinting step, the controller 6 controls such that the magnification correction mechanisms 12 apply a desired compressive force to the mold 7. In such cases, the mold 7 is deformed by the compressive force, and the holding units 23 and 24 of the mold chuck 20 for attracting the mold 7 are also displaced in the X- and Y-directions following the deformation. In other words, the mold 7 does not relatively move with respect to the contact part 27 in contact with the mold 7, and thus, the contact state during attracting does not change. Thus, the ununiformed distortion on the concave and convex pattern 7a may be suppressed, and thus, the mold holding unit 3 may perform the shape correction (magnification correction) of the mold 7 with high accuracy. In this case, the mold chuck 20 has high rigidity in the Z direction serving as the mold-printing direction, and thus, the deformation of the concave and convex pattern 7a in the Z direction, which is caused by the driving of the magnification correction mechanism 12, may be suppressed.

As described above, according to the present embodiment, the magnification correction of the mold 7 may be performed with high accuracy. Furthermore, the position of the contact part 27 with respect to the mold 7 does not change during attracting, and thus, the occurrence of dust (particles) in the imprint apparatus 1 may also be suppressed.

(Other Embodiments)

Figure 5:
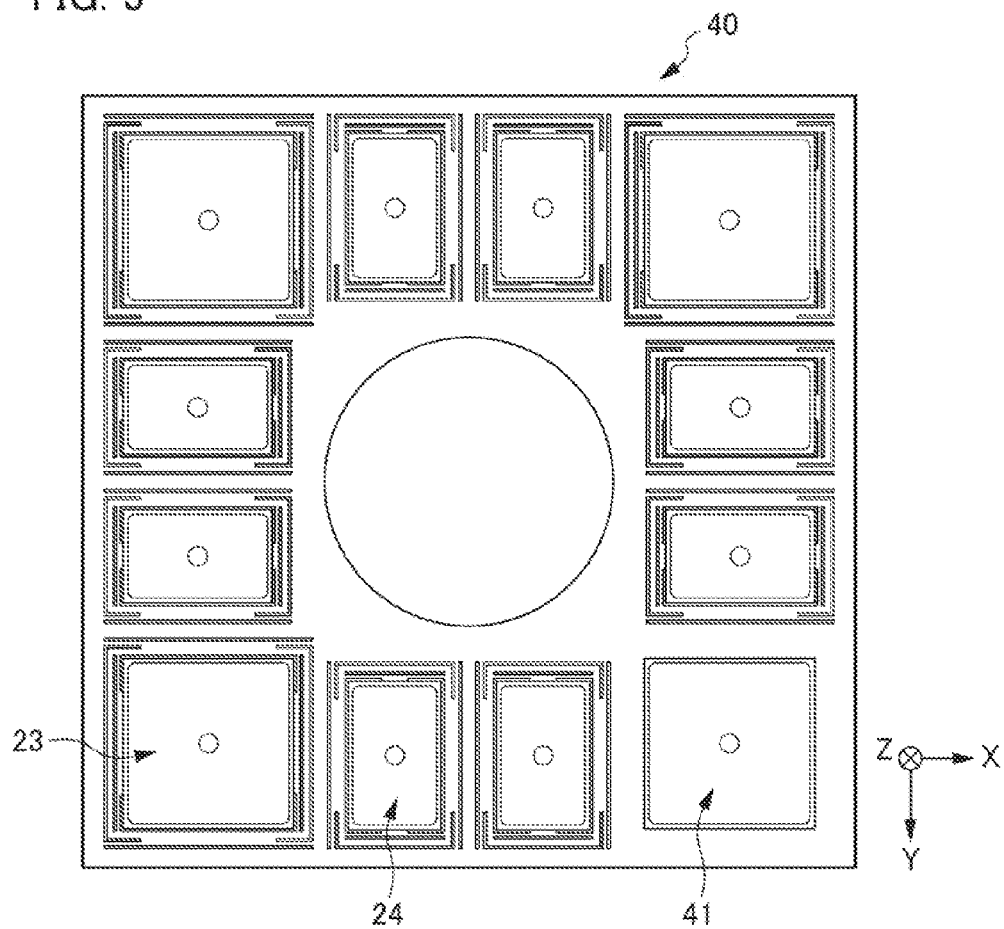
FIG. 5 is a view illustrating the shape of a mold chuck according to another embodiment of the present invention.

FIG. 5 is a view illustrating the shape of a mold chuck 40 according to another embodiment as a variant example of the mold chuck 20. When the mold chuck 20 described above is employed, all of the first holding units 23 and the second holding units 24 are flexibly displaceable in the X- and Y-directions. However, the position of the mold 7 on the imprint apparatus 1 may be uncertain depending on the rigidity of the mold chuck 40 in the X- and Y-directions. Accordingly, the mold chuck 40 shown in FIG. 5 includes only one holding unit 41 that is not provided with penetrating grooves 28 in the X- and Y-directions, that is, does not have leaf springs 29a and 29b. With this arrangement, the holding unit 41 undergoes no displacement even when the magnification correction mechanisms 12 apply a compressive force to the mold 7, and thus, for example, the positioning between the concave and convex pattern 7a of the mold 7 and the wafer 10 is readily made.

Figure 6A:
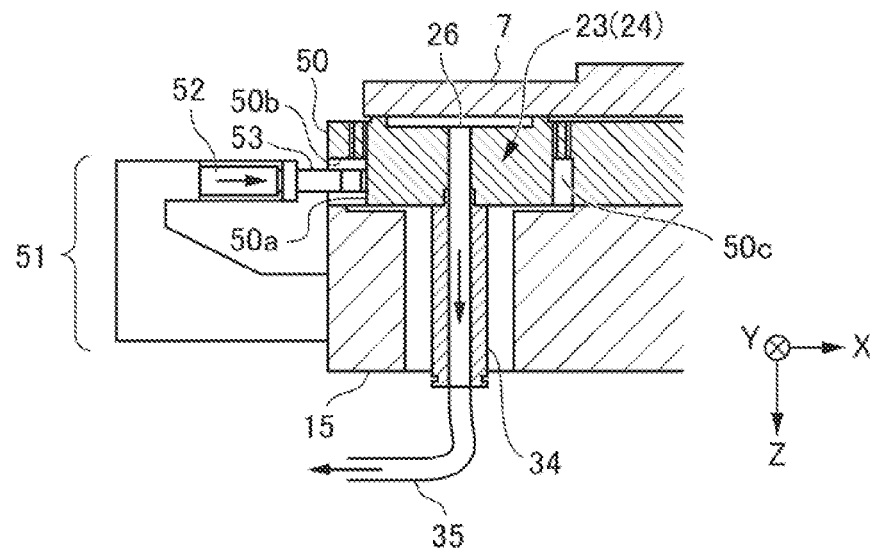
FIG. 6A is a cross sectional view illustrating the configuration of a mold holding unit according to another embodiment of the present invention.
Figure 6B:
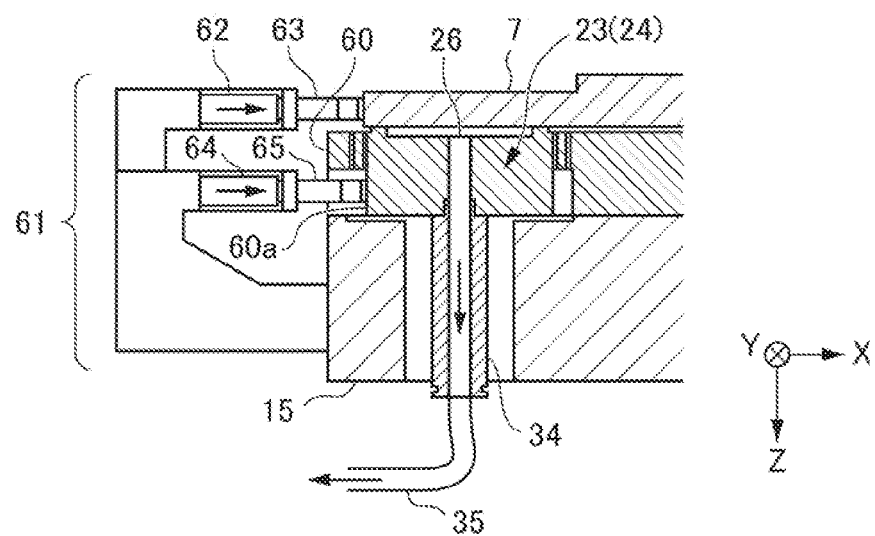
FIG. 6B is a cross sectional view illustrating the configuration of a mold holding unit according to another embodiment of the present invention.

Each of FIGS. 6A and 6B is a view illustrating the configuration of the mold holding unit 3 including a magnification correction mechanism 51 according to another embodiment as a variant example of the mold chuck 20 and the magnification correction mechanism 12. In the aforementioned magnification correction mechanism 12, the actuator 32 applies a compressive force to the lateral surface of the mold 7. However, when the mold 7 has a thin thickness in the Z direction, the region (area) of the lateral surface of the mold 7 is narrow, whereby a sufficient compressive force may be difficult to be applied thereto. Thus, the mold chuck 50 shown in FIG. 6A has a penetrating portion 50b that penetrates from the lateral surface of the mold chuck 50 to the lateral surface of a displacement portion 50a inside each of the penetrating grooves 28 provided in the holding units 23 and 24 so as to be capable of directly applying a compressive force using a magnification correction mechanism 51. In this case, it is desirable that a spacing portion 50c having an opening area equivalent to the penetrating portion 50b be formed in the region of the inner penetrating groove 28 facing the position where the penetrating portion 50b is provided on the basis of the displacement portion 50a. In contrast, the Z-directional height of each of an actuator 52 and a contact member 53 of the magnification correction mechanism 51 is set so as to be substantially coaxial with the center axis of the penetrating portion 50b formed on the mold chuck 50. With this arrangement, the magnification correction mechanism 51 has no structure to apply a compressive force directly to the mold 7, and thus, is advantageous where the mold 7 has a thin thickness in the Z direction.

On the other hand, a mold chuck 60 shown in FIG. 6B has a shape obtained by combining the mold chuck 20 described above with the mold chuck 50 shown in FIG. 6A. Also, a magnification correction mechanism 61 includes a first actuator 62 and a first contact member 63 that apply a compressive force to the lateral surface of the mold 7, and a second actuator 64 and a second contact member 65 that apply a compressive force to the lateral surface of the displacement portion 60a of each of the holding units 23 and 24. In this case, the controller 6 determines the drive amount of the second actuator 64 based on, for example, the drive amount of the first actuator 62 so that the amount of movement of the mold 7 may be equal to that of the contact part 27. Thus, the magnification correction mechanism 61 is advantageous when the positional shift between the mold 7 and the contact part 27 undesirably occurs only by applying a compressive force to either one of the mold 7 or the displacement portion 60a such as when an attraction force is insufficient, when the rigidity of the leaf springs 29a and 29b is great, or the like.

In the aforementioned embodiments, although a magnification correction mechanism is configured by applying a compressive force to the region of the lateral surfaces of the outer peripheral portion of the mold 7, the present invention is not limited thereto. For example, a protrusion may be newly formed on the attraction surface 22 side of the mold 7 such that a magnification correction mechanism may be configured to apply a compressive force to the region of the protrusion instead of the lateral surfaces of the mold 7.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using an imprint apparatus configuring the lithography system described above. Further, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-020494 filed Feb. 2, 2011 which is hereby incorporated by reference herein in its entirety.

What is claimed is:

1. A holding apparatus for holding a mold that has a pattern on a surface, the apparatus comprising:
   a chuck having a plurality of attraction units that vacuum-attracts the mold, and configured to hold the mold by the plurality of attraction units; and
   an actuator configured to apply a force to the mold to deform the mold for magnification correction thereof,
   wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold, and
   wherein the at least one of the plurality of attraction units includes an exhaust portion, and a contact part, to be in contact with the mold, that is formed around the exhaust portion, a plurality of grooves being formed around the contact part in the chuck.

2. The holding apparatus according to claim 1, wherein the at least one of the plurality of attraction units is displaceable via a leaf spring, included in the chuck, in which the plurality of grooves are formed.

3. The holding apparatus according to claim 1, further comprising:
   an actuator configured to apply a force to a side surface of the chuck.

4. The holding apparatus according to claim 3, further comprising:
   a controller configured to control a force to be applied to the side surface of the chuck by the actuator applying the force to the side surface of the chuck based on a force to be applied to the side surface of the mold by the actuator applying the force to the side surface of the mold.

5. The holding apparatus according to claim 1, further comprising:
   a chuck base configured to support the chuck;
   a controller configured to control the actuator; and
   at least one detector supported by the chuck base and configured to detect a position of a side surface of the mold,
   wherein the controller is configured to control a force for deforming the mold by the actuator based on an output of the detector.

6. The holding apparatus according to claim 1, wherein each of the plurality of grooves penetrates from an attraction surface of the chuck that vacuum-attracts the mold to a surface of the chuck opposite from the attraction surface.

7. An imprint apparatus that molds an imprint material on a substrate using a mold to form a pattern on the substrate, the apparatus comprising:
   a holding apparatus comprising:
   a chuck having a plurality of attraction units that vacuum-attracts the mold, and configured to hold the mold by the plurality of attraction units;
   an actuator configured to apply a force to to deform the mold for magnification correction thereof,
   wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold, and wherein the at least one of the plurality of attraction units includes an exhaust portion, and a contact part, to be in contact with the mold, that is formed around the exhaust portion, a plurality of grooves being formed around the contact part in the chuck; and
   a substrate stage configured to hold the substrate.

8. A method of manufacturing an article, the method comprising:
   forming a pattern on a substrate using an imprint apparatus, wherein the imprint apparatus molds an imprint material on the substrate using a mold to form the pattern on the substrate, and includes a holding apparatus, and a substrate stage configured to hold the substrate, and wherein the holding apparatus includes a chuck having a plurality of attraction units that vacuum-attracts the mold, and configured to hold the mold by the plurality of attraction units; and an actuator configured to apply a force to the mold to deform the mold for magnification correction thereof, wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold, and wherein the at least one of the plurality of attraction units includes an exhaust portion, and a contact part, to be in contact with the mold, that is formed around the exhaust portion, a plurality of grooves being formed around the contact part in the chuck; and
   etching the substrate, on which the pattern has been formed, to manufacture the article.

9. A holding apparatus for holding a mold that has a pattern on a surface, the apparatus comprising:
   a chuck having a plurality of attraction units that vacuum-attracts the mold, and configured to hold the mold by the plurality of attraction units; and
   an actuator configured to apply a force to the mold to deform the mold for magnification correction thereof,
   wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold,
   wherein the at least one of the plurality of attraction units includes an exhaust portion, and a contact part, to be in contact with the mold, that is formed around the exhaust portion, a plurality of grooves being formed around the contact part in the chuck, and
   wherein the at least one of the plurality of attraction units is displaceable via a leaf spring, included in the chuck, in which one of the plurality of grooves are formed such that the leaf spring is elastic in a direction.

10. The holding apparatus as claimed in claim 9, further comprising an actuator configured to apply a compressive force to at least one of a first side surface of the chuck in an X direction and a second side surface of the chuck in a Y direction, wherein the compressive force causes the leaf spring to deform.

11. A holding apparatus for holding a mold, the apparatus comprising:
 a chuck having a plurality of attraction units that attracts the mold, and configured to hold the mold by the plurality of attraction units; and
 an actuator configured to deform the mold by applying a force in a plane orthogonal to a direction of attraction of the mold by the chuck,
 wherein at least one of the plurality of attraction units is displaceable relative to another of the plurality of attraction units in a direction along the force applied by the actuator via an elastic member, included in the chuck, which is elastic in a direction such that relative positions between the plurality of attraction units are changed in accordance with the deformed mold.

12. An imprint apparatus that molds an imprint material on a substrate using a mold to form a pattern on the substrate, the apparatus comprising:
 a holding apparatus comprising: a chuck having a plurality of attraction units that attracts the mold, and configured to hold the mold by the plurality of attraction units; and an actuator configured to deform the mold by applying a force in a plane orthogonal to a direction of attraction of the mold by the chuck, wherein at least one of the plurality of attraction units is displaceable relative to another of the plurality of attraction units in a direction along the force applied by the actuator via an elastic member, included in the chuck, which is elastic in a direction such that relative positions between the plurality of attraction units are changed in accordance with the deformed mold; and
 a substrate stage configured to hold the substrate.

13. A method of manufacturing an article, the method comprising:
 forming a pattern on a substrate using an imprint apparatus, wherein the imprint apparatus molds an imprint material on the substrate using a mold to form the pattern on the substrate, and includes a holding apparatus, and a substrate stage configured to hold the substrate, and wherein the holding apparatus includes a chuck having a plurality of attraction units that attracts the mold, and configured to hold the mold by the plurality of attraction units; and an actuator configured to deform the mold by applying a force in a plane orthogonal to a direction of attraction of the mold by the chuck, wherein at least one of the plurality of attraction units is displaceable relative to another of the plurality of attraction units in a direction along the force applied by the actuator via an elastic member, included in the chuck, which is elastic in a direction such that relative positions between the plurality of attraction units are changed in accordance with the deformed mold; and
 etching the substrate, on which the pattern has been formed, to manufacture the article.

14. A holding apparatus for holding a mold that has a pattern on a surface, the apparatus comprising:
 a chuck having a plurality of attraction units that attracts the mold, and configured to hold the mold by the plurality attraction units; and
 an actuator configured to apply a force to the mold to deform the mold for magnification correction thereof,
 wherein at least one of the plurality of attraction units is displaceable relative to another of the plurality of attraction units in a direction along the force, in a state that the at least one of the plurality of attraction units attracts the mold, in a case where the actuator applies the force to the mold, such that relative positions between the plurality of attraction units are changed in accordance with the deformed mold.

15. An imprint apparatus that molds an imprint material on a substrate using a mold to form a pattern on the substrate, the apparatus comprising:
 a holding apparatus comprising: a chuck having a plurality of attraction units that attracts the mold, and configured to hold the mold by the plurality of attraction units; and an actuator configured to apply a force to the mold to deform the mold for magnification correction thereof, wherein at least one of the plurality of attraction units is displaceable relative to another of the plurality of attraction units in a direction along the force, in a state that the at least one of the plurality of attraction units attracts the mold, in a case where the actuator applies the force to the mold, such that relative positions between the plurality of attraction units are changed in accordance with the deformed mold; and
 a substrate stage configured to hold the substrate.

16. A method of manufacturing an article, the method comprising:
 forming a pattern on a substrate using an imprint apparatus, wherein the imprint apparatus molds an imprint material on the substrate using a mold to form the pattern on the substrate, and includes a holding apparatus, and a substrate stage configured to hold the substrate, and wherein the holding apparatus includes a chuck having a plurality of attraction units that attracts the mold, and configured to hold the mold by the plurality of attraction units; and an actuator configured to apply a force to the mold to deform the mold for magnification correction thereof, wherein at least one of the plurality of attraction units is displaceable relative to another of the plurality of attraction units in a direction along the force, in a state that the at least one of the plurality of attraction units attracts the mold, in a case where the actuator applies the force to the mold, such that relative positions between the plurality of attraction units are changed in accordance with the deformed mold; and
 etching the substrate, on which the pattern has been formed, to manufacture the article.

17. A holding apparatus for holding a mold that has a pattern on a surface, the apparatus comprising:
 a chuck having a plurality of attraction units that vacuum-attracts the mold, and configured to hold the mold by the plurality of attraction units; and
 an actuator configured to apply a force to the mold to deform the mold for magnification correction thereof,
 wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold, and
 wherein the at least one of the plurality of attraction units includes an exhaust portion, and a contact part, to be in contact with mold, that is formed around the exhaust portion, a plurality of grooves being formed around the contact part in the chuck so that the at least one of the plurality of attraction units is displaceable in each of two directions along the force.

18. An imprint apparatus that molds an imprint material on a substrate using a mold to form a pattern on the substrate, the apparatus comprising:
a holding apparatus comprising:
a chuck having a plurality of attraction units that vacuum-attracts the mold, and configured to hold the mold by the plurality of attraction units;
and
an actuator configured to apply a force to the mold to deform the mold for magnification correction thereof,
wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold, and wherein the at least one of the plurality of attraction units includes an exhaust portion, and a contact part, to be in contact with the mold, that is formed around the exhaust portion, a plurality of grooves being formed around the contact part in the chuck so that the at least one of the plurality of attraction units is displaceable in each of two directions along the force; and
a substrate stage configured to hold the substrate.

19. A method of manufacturing an article, the method comprising:
forming a pattern on a substrate using an imprint apparatus, wherein the imprint apparatus molds an imprint material on the substrate using a mold to form the pattern on the substrate, and includes a holding apparatus, and a substrate stage configured to hold the substrate, and wherein the holding apparatus includes a chuck having a plurality of attraction units that vacuum-attracts the mold, and configured to hold the mold by the plurality of attraction units; and an actuator configured to apply a force to the mold to deform the mold for magnification correction thereof, wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold, and wherein the at least one of the plurality of attraction units includes an exhaust portion, and a contact part, to be in contact with the mold, that is formed around the exhaust portion, a plurality of grooves being formed around the contact part in the chuck so that the at least one of the plurality of attraction units is displaceable in each of two directions along the force; and
etching the substrate, on which the pattern has been formed, to manufacture the article.

20. A holding apparatus for holding a mold that has a pattern on a surface, the apparatus comprising:
a chuck having a plurality of attraction units that vacuum-attracts the mold, and configured to hold the mold by the plurality of attraction units; and an actuator configured to apply a force to the mold to deform the mold for magnification correction thereof,
wherein at least one of the plurality of attraction units is displaceable relative to another of the plurality of attraction units in a direction along the force, in a state that the at least one of the plurality of attraction units vacuum-attracts the mold, in a case where the actuator applies the force to the mold, so that relative positions between the plurality of attraction units are changed in accordance with the deformed mold,
wherein the at least one of the plurality of attraction units includes an exhaust portion, and a contact part, to be in contact with the mold, that is formed around the exhaust portion, a plurality of includes an exhaust portion, and a contact part, to be in contact with the mold, that is formed around the exhaust portion, a plurality of grooves being formed around the contact part in the chuck so that the at least one of the plurality of attraction units is displaceable in each of two directions along the force, and
wherein the at least one of the plurality of attraction units is displaceable via a leaf spring, included in the chuck, in which one of the plurality of grooves are formed such that the leaf spring is elastic in a direction.

21. A holding apparatus for holding a mold, the apparatus comprising:
a chuck having a plurality of attraction units that attracts the mold, and configured to hold the mold by the plurality of attraction units; and
an actuator configured to deform the mold by applying a force in a plane orthogonal to a direction of attraction of the mold by the chuck,
wherein at least one of the plurality of attraction units is displaceable relative to another of the plurality of attraction units in a direction along the force applied by the actuator via an elastic member, included in the chuck, which is elastic in each of two directions along the force such that relative positions between the plurality of attraction units are changed in accordance with the deformed mold.

22. An imprint apparatus that molds an imprint material on a substrate using a mold to form a pattern on the substrate, the apparatus comprising:
a holding apparatus comprising: a chuck having a plurality of attraction units that attracts the mold, and configured to hold the mold by the plurality of attraction units; and an actuator configured to deform the mold by applying a force in a plane orthogonal to a direction of attraction of the mold by the chuck, wherein at least one of the plurality of attraction units is displaceable relative to another of the plurality of attraction units in a direction of the force applied by the actuator via an elastic member, included in the chuck, which is elastic in each of two directions along the force such that relative positions between the plurality of attraction units are changed in accordance with the deformed mold; and
a substrate stage configured to hold the substrate.

23. A method of manufacturing an article, the method comprising:
forming a pattern on a substrate using an imprint apparatus, wherein the imprint apparatus molds an imprint material on the substrate using a mold to form the pattern on the substrate, and includes a holding apparatus, and a substrate stage configured to hold the substrate, and wherein the holding apparatus includes a chuck having a plurality of attraction units that attracts the mold, and configured to hold the mold by the plurality of attraction units; and an actuator configured to deform the mold by applying a force in a plane orthogonal to a direction of attraction of the mold by the chuck, wherein at least one of the plurality of attraction units is displaceable relative to another of the plurality of attraction units in a direction of the force applied by the actuator via an elastic member, included in the chuck, which is elastic in each of two directions along the force such that relative positions between the plurality of attraction units are changed in accordance with the deformed mold; and etching the substrate, on which the pattern has been formed, to manufacture the article.

24. A holding apparatus for holding a mold that has a pattern on a surface, the apparatus comprising:

a chuck having a plurality of attraction units that attracts the mold, and configured to hold the mold by the plurality attraction units; and an actuator configured to apply a force to the mold to deform the mold for magnification correction thereof, wherein at least one of the plurality of attraction units is displaceable relative to another of the plurality of attraction units in each of two directions along the force, in a state that the at least one of the plurality of attraction units attracts the mold, in a case where the actuator applies the force to the mold, such that relative positions between the plurality of attraction units are changed in accordance with the deformed mold.

25. An imprint apparatus that molds an imprint material on a substrate using a mold to form a pattern on the substrate, the apparatus comprising:

a holding apparatus comprising: a chuck having a plurality of attraction units that attracts the mold, and configured to hold the mold by the plurality of attraction units; and an actuator configured to apply a force to the mold to deform the mold for magnification correction thereof, wherein at least one of the plurality of attraction units is displaceable relative to another of the plurality of attraction units in each of two directions along the force, in a state that the at least one of the plurality of attraction units attracts the mold, in a case where the actuator applies the force to the mold, such that relative positions between the plurality of attraction units are changed in accordance with the deformed mold; and a substrate stage configured to hold the substrate.

26. A method of manufacturing an article, the method comprising:

forming a pattern on a substrate using an imprint apparatus, wherein the imprint apparatus molds an imprint material on the substrate using a mold to form the pattern on the substrate, and includes a holding apparatus, and a substrate stage configured to hold the substrate, and wherein the holding apparatus includes a chuck having a plurality of attraction units that attracts the mold, and configured to hold the mold by the plurality of attraction units; and an actuator configured to apply a force to the mold to deform the mold for magnification correction thereof, wherein at least one of the plurality of attraction units is displaceable relative to another of the plurality of attraction units in each of two directions along the force, in a state that the at least one of the plurality of attraction units attracts the mold, in a case where the actuator applies the force to the mold, such that relative positions between the plurality of attraction units are changed in accordance with the deformed mold; and etching the substrate, on which the pattern has been formed, to manufacture the article.

* * * * *